United States Patent
Gomez et al.

(10) Patent No.: US 9,325,372 B2
(45) Date of Patent: Apr. 26, 2016

(54) UPSTREAM POWER AMPLIFIER

(71) Applicant: BROADCOM CORPORATION, Irvine, CA (US)

(72) Inventors: Ramon Alejandro Gomez, San Juan Capistrano, CA (US); Avraham Kliger, Ramat Gan (IL); Thomas Joseph Kolze, Phoenix, AZ (US); Kevin Lee Miller, Lawrenceville, GA (US); Joseph Leonard Laskowski, Newport Coast, CA (US)

(73) Assignee: BROADCOM CORPORATION, Irvine, CA (US)

( * ) Notice: Subject to any disclaimer, the term of this patent is extended or adjusted under 35 U.S.C. 154(b) by 30 days.

(21) Appl. No.: 14/457,781

(22) Filed: Aug. 12, 2014

(65) Prior Publication Data
US 2015/0043625 A1    Feb. 12, 2015

Related U.S. Application Data

(60) Provisional application No. 61/865,085, filed on Aug. 12, 2013.

(51) Int. Cl.
| | | |
|---|---|---|
| H04B 3/32 | (2006.01) | |
| H04L 27/26 | (2006.01) | |
| H03F 3/21 | (2006.01) | |
| H03F 3/24 | (2006.01) | |
| H04B 1/04 | (2006.01) | |

(52) U.S. Cl.
CPC ............ *H04B 3/32* (2013.01); *H03F 3/211* (2013.01); *H03F 3/245* (2013.01); *H04L 27/2646* (2013.01); *H03F 2200/534* (2013.01); *H03F 2200/541* (2013.01); *H04B 1/0475* (2013.01); *H04B 2001/0416* (2013.01); *H04L 27/2626* (2013.01)

(58) Field of Classification Search
CPC ............ H04L 27/2626; H04L 27/2646; H04B 1/0475; H04B 2001/0416; H04B 2001/0433; H04B 3/32; H03F 3/245; H03F 3/211; H03F 2200/534; H03F 2200/541
See application file for complete search history.

(56) References Cited

U.S. PATENT DOCUMENTS

| | | | | |
|---|---|---|---|---|
| 6,553,018 | B1* | 4/2003 | Ichihara | 370/342 |
| 7,809,393 | B2* | 10/2010 | Runze et al. | 455/522 |
| 2008/0112506 | A1* | 5/2008 | Strong | 375/300 |

* cited by examiner

*Primary Examiner* — Sophia Vlahos
(74) *Attorney, Agent, or Firm* — Garlick & Markison; Shayne X. Short

(57) ABSTRACT

A communication device includes a communication interface, a number of variable power amplifiers (VPAs), and a processor. Some of the VPAs are configured to process analog signals to generate processed analog signals (e.g., each VPA configured to process one of the analog signals to generate one of the processed analog signals based on a respective VPA control signal). A composite VPA processes a summation of the processed analog signals, which are generated by certain of the VPA, to generate a processed composite signal based on a composite VPA control signal. The processor generates the a first, a second, and a composite VPA control signals based, at least in part, on configuration information from another communication device via the communication interface. The processor may be configured to consider other information as well, such as locally generated information (within the communication device), operational history, current operating conditions, etc.

20 Claims, 9 Drawing Sheets

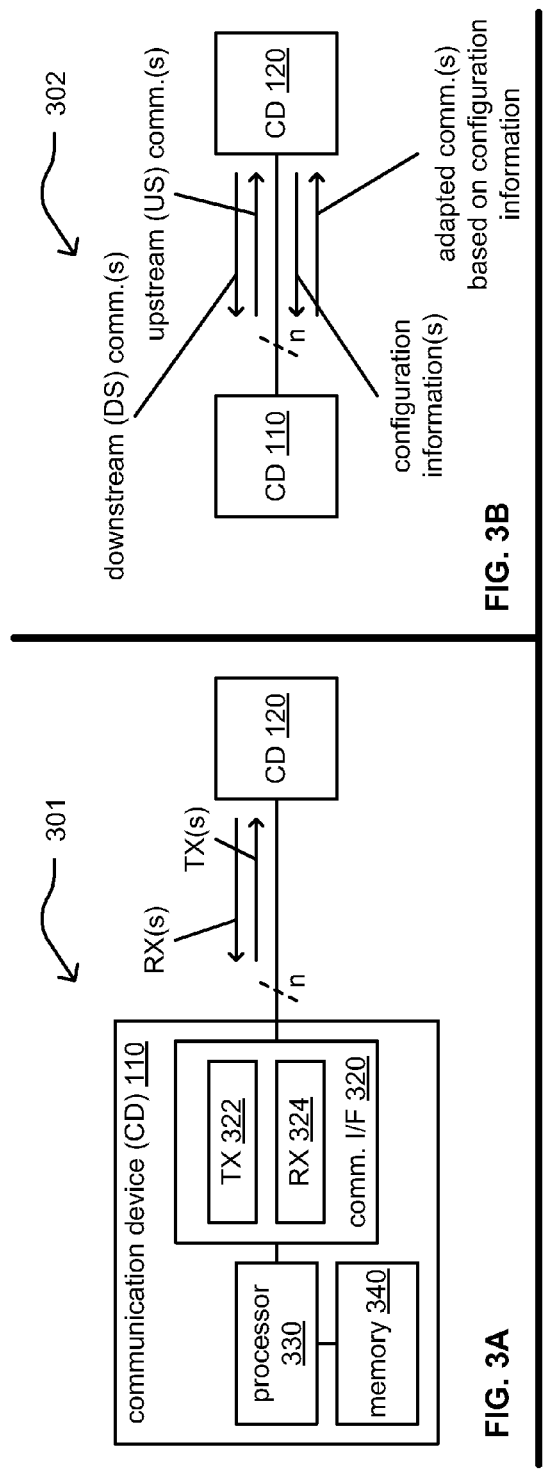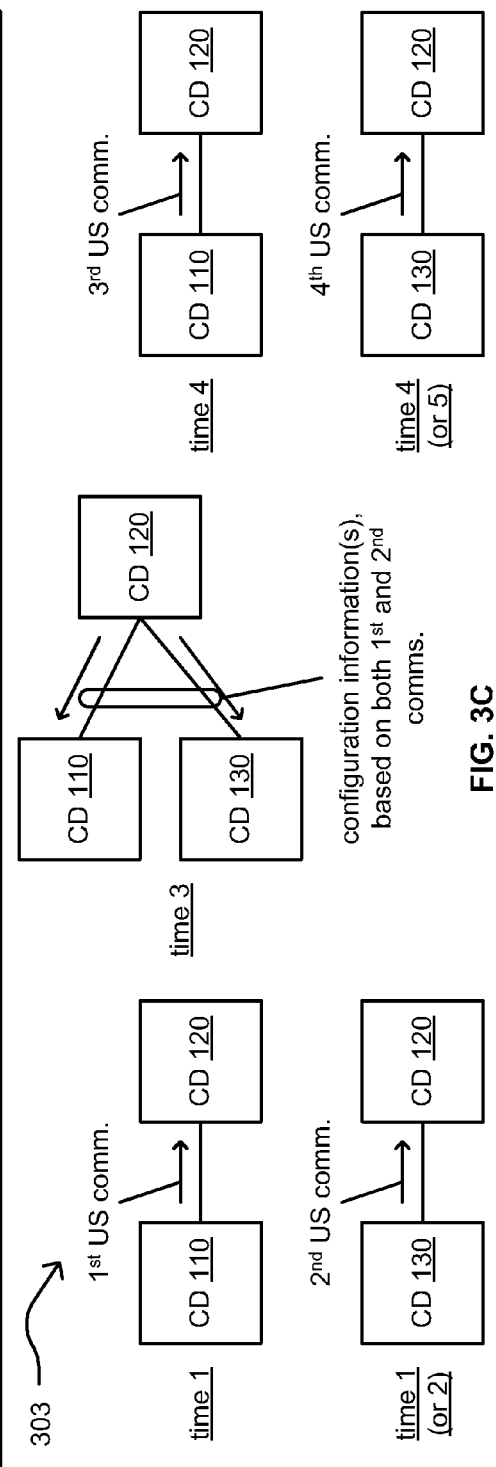

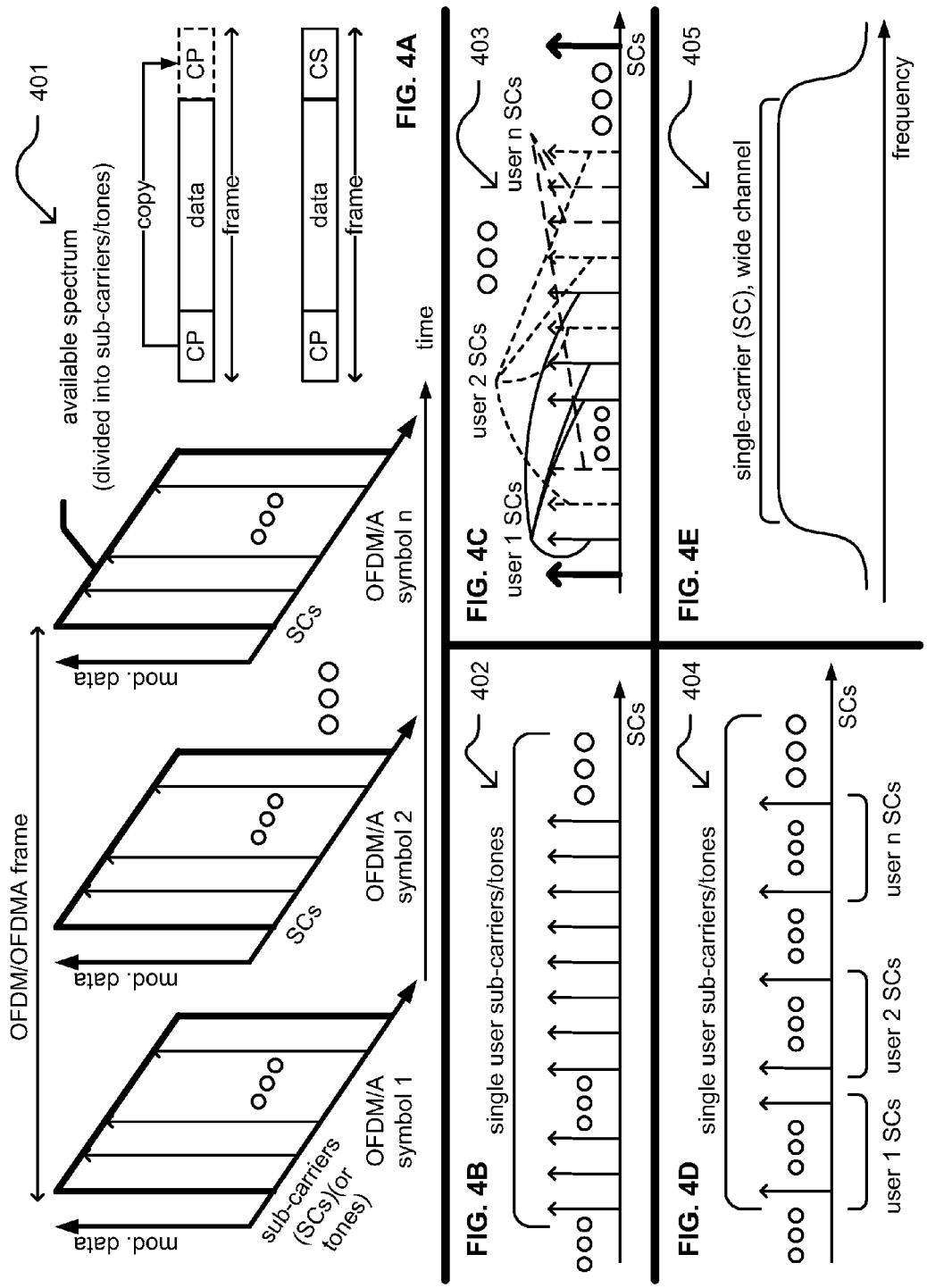

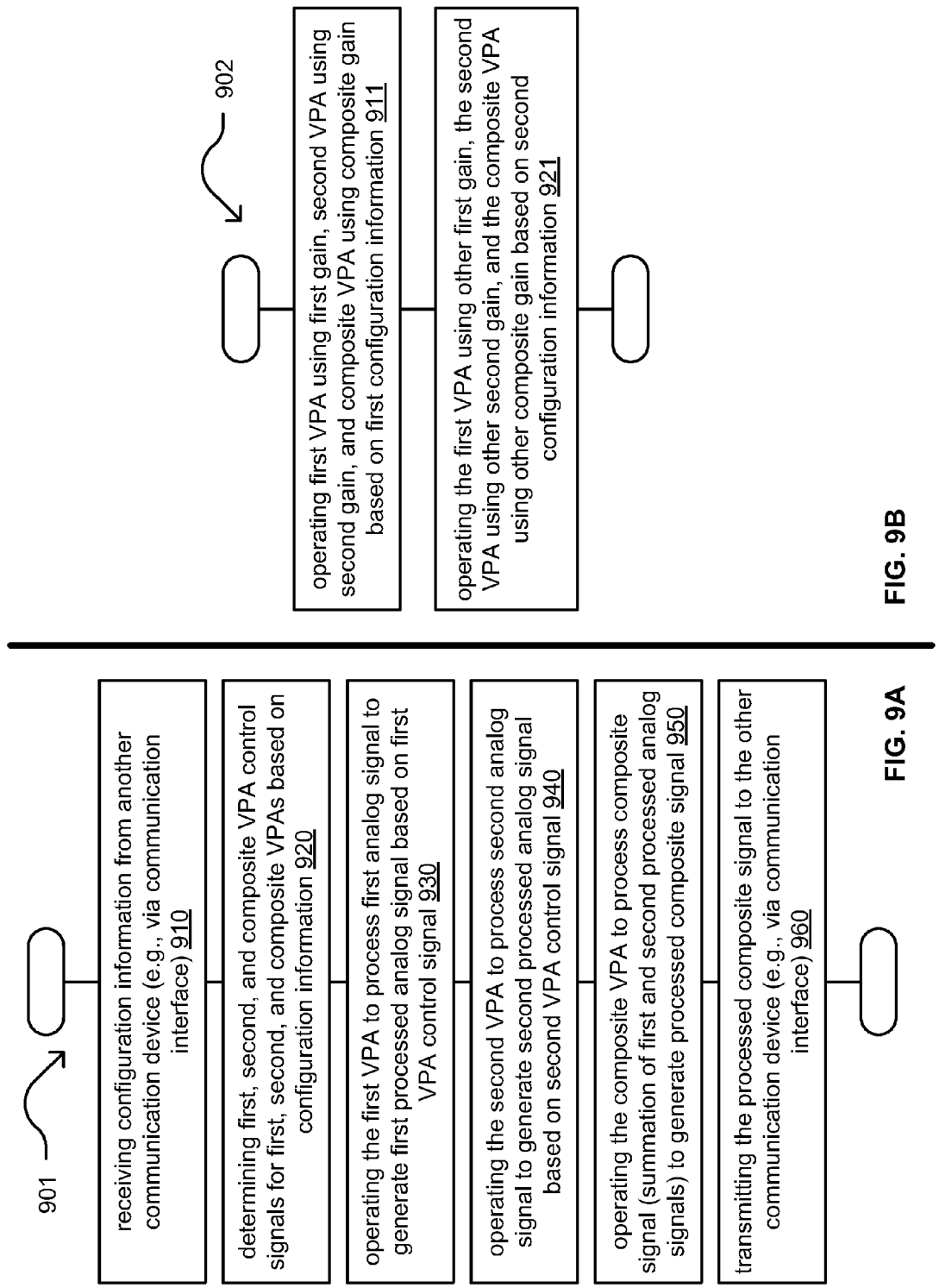

UPSTREAM POWER AMPLIFIER

CROSS REFERENCE TO RELATED PATENTS/PATENT APPLICATIONS

Provisional Priority Claims

The present U.S. Utility patent application claims priority pursuant to 35 U.S.C. §119(e) to U.S. Provisional Application No. 61/865,085, entitled "Upstream power amplifier," filed Aug. 12, 2013, which is hereby incorporated herein by reference in its entirety and made part of the present U.S. Utility patent application for all purposes.

BACKGROUND

1. Technical Field

The present disclosure relates generally to communication systems; and, more particularly, to scaling and gain control within such communication systems.

2. Description of Related Art

Data communication systems have been under continual development for many years. The primary goal within such communication systems is to transmit information successfully between devices. Some communication systems operate in a one-to-many configuration such that one communication device is connected to and services communication from multiple other devices. For example, in a cable-based system, a headend device may service a number of cable modems. When multiple cable modems are transmitting upstream to the headend device at the same time, a great deal of noise may be generated by them. For example, the headend device will receive multiple signals from the multiple cable modems that are transmitting and the combined effect of all of those received signals will elevate the noise floor from the perspective of the headend device.

The prior art does not provide an adequate means by which the deleterious effects of multiple transmitting devices may be reduced, mitigated, or eliminated. As the number of downstream devices served by a headend device in such a one-to-many configuration continues to increase, the problems associated with the simultaneous transmission from them continues to increase.

BRIEF DESCRIPTION OF THE SEVERAL VIEWS OF THE DRAWINGS

FIG. 3A is a diagram illustrating a communication device operative within one or more communication systems.

FIG. 3B is a diagram illustrating an example of operation of a communication device within one or more communication systems.

FIG. 3C is a diagram illustrating another example of operation of a communication device within one or more communication systems.

FIG. 4A is a diagram illustrating an example of orthogonal frequency division multiplexing (OFDM) and/or orthogonal frequency division multiple access (OFDMA).

FIG. 4B is a diagram illustrating another example of OFDM and/or OFDMA.

FIG. 4C is a diagram illustrating another example of OFDM and/or OFDMA.

FIG. 4D is a diagram illustrating another example of OFDM and/or OFDMA.

FIG. 4E is a diagram illustrating an example of single-carrier (SC) signaling.

FIG. 9A is a diagram illustrating an embodiment of a method for execution by one or more communication devices.

FIG. 9B is a diagram illustrating another embodiment of a method for execution by one or more communication devices.

DETAILED DESCRIPTION

Figure 1:
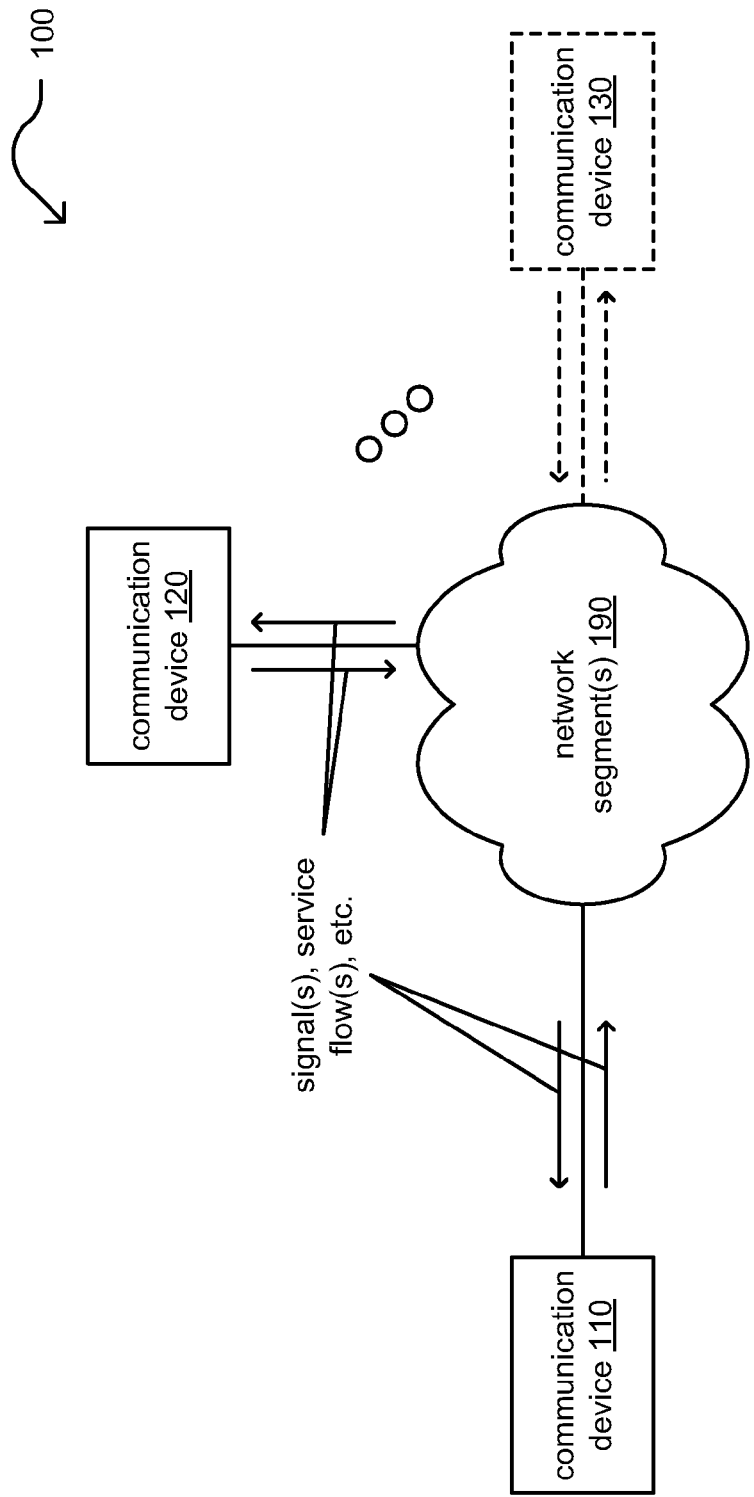
FIG. 1 is a diagram illustrating an embodiment of one or more communication systems.

FIG. 1 is a diagram illustrating an embodiment 100 of one or more communication systems. One or more network segments 190 provide communication inter-connectivity for at least two communication devices 110 and 120 (also referred to as CDs in certain locations in the diagrams). Note that general reference to a communication device may be made generally herein using the term 'device' (e.g., device 110 or CD 110 when referring to communication device 110, or devices 110 and 120, or CDs 110 and 120, when referring to communication devices 110 and 120). Generally speaking, any desired number of communication devices are included within one or more communication systems (e.g., as shown by communication device 130).

The various communication links within the one or more network segments 190 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 120 may include some segments of wired communication links and other segments of optical communication links. Note also that the devices 110-130 may be of a variety of types of devices including stationary devices, mobile devices, portable devices, etc. and may support communications for any of a number of services or service flows including data, telephony, television, Internet, media, synchronization, etc.

In an example of operation, device 110 includes a communication interface to support communications with one or more of the other devices 120-130. Device 110 may also include a processor configured to generate signals for transmission and appropriately process receives signals. The processor may be configured to direct operation of other components within device 110 as well, such as variable power amplifiers (VPAs) and/or other components employed in an analog front end (AFE) configured to generate and process continuous-time signals.

This communication from device 110 may be bidirectional/to and from the one or more of the other devices 120-

130 or unidirectional (or primarily unidirectional) from the one or more of the other devices 120-130. In some instances, two of the devices are 110-130 are in a point-to-point communication link with one another, and in others, one of the devices 110-130 is configured in a one-to-many configuration with two or more of the other devices 110-130. For example, device 130 may serve as a headend device implemented in a one-to-many configuration to support communications with devices 110 and 120.

In another example of operation, device 110 includes a communication interface, a number of variable power amplifiers (VPAs), and a processor. Some of the VPAs are configured to process analog signals to generate processed analog signals (e.g., each VPA configured to process one of the analog signals to generate one of the processed analog signals based on a respective VPA control signal). A composite VPA processes a summation of the processed analog signals, which are generated by some of the VPAs, to generate a processed composite signal based on a composite VPA control signal. The processor generates the first, second, and composite VPA control signals based, at least in part, on configuration information from another communication device via the communication interface. The processor may be configured to consider other information as well, such as locally generated information (within the communication device), operational history, current operating conditions, etc.

When considering operation within a one-to-many configuration, such as when device 130 may serve as a headend device implemented in a one-to-many configuration to support communications with devices 110 and 120, device 130 provides configuration information to both devices 110 and 120 to direct the manner by which they adjust the gains of their respective VPAs. In this configuration, the headend device 130 coordinates the operation of two or more of the downstream devices so that their cumulative operation mitigates or eliminates the noise received at device 130. Devices 110 and 120, when configured to adjust their operation including adjustment of gain and scaling performed by one or more power amplifiers (PAs) (which may be implemented as variable power amplifiers (VPAs)), can significantly reduce the overall noise within the system. As an example, device 110 may include two VPAs that each process first and second analog signals, respectively, to generate first and second processed analog signals, respectively, and then a composite VPA processes the combination of the first and second processed analog signals to generate a processed composite signal for transmission to device 130. Device 110 appropriately adjusts operation of each of its VPAs to minimize, mitigate, or eliminate its contribution to overall noise introduced into the system.

Figure 2:
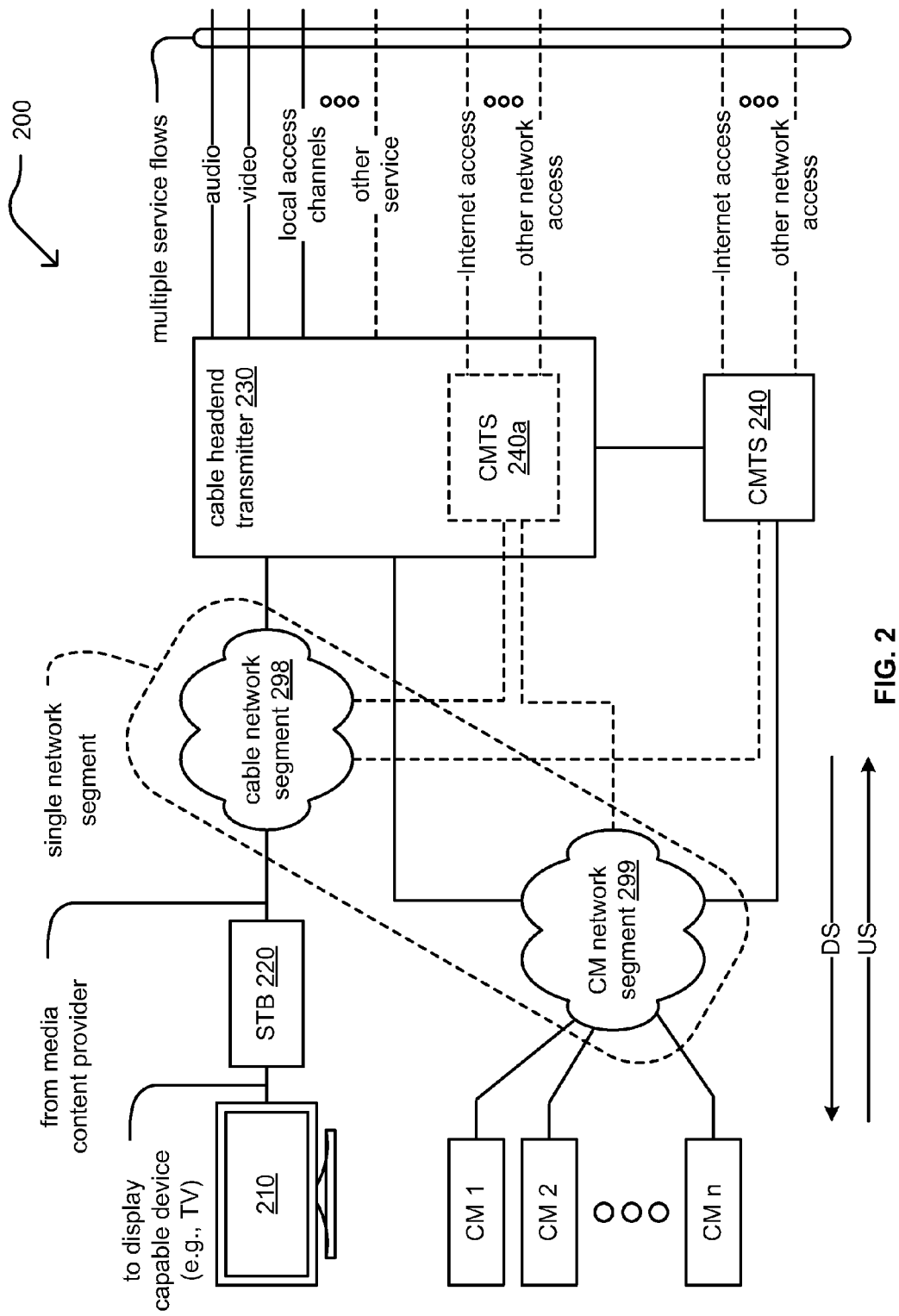
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240a. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-n to the CMTS (shown as 240 or 240a). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 240 (or 240a) is a component that exchanges digital signals with cable modems 1-n on the cable modem network segment 299. Each of the cable modems is coupled to the cable modem network segment 299, and a number of elements may be included within the cable modem network segment 299. For example, routers, splitters, couplers, relays, and amplifiers may be contained within the cable modem network segment 299. Generally speaking, downstream information may be viewed as that which flows from the CMTS 240 to the connected cable modems (e.g., CM 1, CM 2, etc.), and upstream information is that which flows from the cable modems to the CMTS 240.

Any one of the devices in embodiment 200 (e.g., CMs 1-n, cable headend transmitter 230, CMTS 240a, and/or CMTS 240) may include functionality to generate and process signals to be transmitted to any other of the devices via any functional pathway in the system. For example, any one of the devices in embodiment 200 may be configured to include a communication interface to support communications with any of the other devices and also include a processor to generate various signals for transmission to any of the other devices and to process various other signals received from any of the other devices.

In an example of operation, a cable modem (e.g., CM 1) includes a communication interface, a number of VPAs, and a processor. Some of the VPAs are configured to process analog signals to generate processed analog signals (e.g., first VPA configured to process first analog signal to generate first processed analog signal based on a first VPA control signal, second VPA configured to process second analog signal to generate second processed analog signal based on a second VPA control signal, etc.). A composite VPA processes a summation of the processed analog signals, which are generated by other of the VPAs, to generate a processed composite signal based on a composite VPA control signal. The processor generates the first, second, and composite VPA control signals based, at least in part, on configuration information from another communication device via the communication interface. The processor may be configured to consider other information as well, such as locally generated information (within the communication device), operational history, current operating conditions, etc.

Each of the other cable modems (e.g., CMs 2-n) may be implemented to include similar functionality and capabilities as CM 1. When multiple cable modems are transmitting to the cable headend device (e.g., CMTS 240a or CMTS 240) and appropriately adjusting the operation of their respective VPAs, the overall noise floor generated at the cable headend device will be reduced, mitigated, or eliminated. Note that the cable headend device may be configured to provide configuration information to each of the respective cable modems when considering the overall communication system operating conditions as well as the particular operational parameters by which each of the cable modems will operate. For example, different cable modems can transmit different amounts of information, using different orthogonal frequency division multiplexing (OFDM) sub-carriers or sets of OFDM sub-carriers, for different durations of time, etc. simultaneously or at different times. The cable headend device can provide configuration information to the cable modems based on consideration of multiple operational conditions for itself, the various cable modems, and/or any other devices within the system. A given cable modem may also consider, if desired, additional information in conjunction with the configuration information provided from the cable headend device (e.g., locally generated information (within the communication device), operational history, current operating conditions, etc.) when determining the specific configuration and settings of its VPAs for transmission of signals to the cable headend device.

FIG. 3A is a diagram 301 illustrating a communication device (CD) 110 operative within one or more communication systems. The device 110 includes a communication interface 320 and a processor 330. The communication interface 320 includes functionality of a transmitter 322 and a receiver 324 to support communications with one or more other devices within a communication system. The device 110 may also include memory 340 to store information including one or more signals generated by the device 110 or such information received from other devices (e.g., device 120) via one or more communication channels. Memory 340 may also include and store various operational instructions for use by the processor 330 in regards to the processing of messages and/or other received signals and generation of other messages and/or other signals including those described herein. The communication interface 320 supports communications to and from one or more other devices (e.g., CD 120 and/or other communication devices). Operation of the communication interface 320 may be directed by the processor 330 such that processor 330 transmits and receives signals (TX(s) and RX(s)) via the communication interface 320.

Memory 340 may also include and store information related to characteristics associated with configuration information received from device 120, locally generated information (e.g., generated by device 110), operational history of the device 110 or other devices within the system, current operating conditions of device 110, other devices within the system, or communication links within the system, etc. Memory 340 may also include information associated with operational instructions for use by processor 330 to process configuration information received from device 120 to determine any operational parameter by which device 110 will operate.

In an example of operation, device 110 includes variable power amplifiers (VPAs) configured to process at least one analog signal, based on at least one VPA control signal, to generate at least one processed analog signal. A composite VPA processes, based on composite VPA control signal, a composite signal that is a summation of processed analog signals that have been generated by other VPAs to generate a processed composite signal. The VPAs may be configured within the communication interface 320 in some embodiments (e.g., as analog components within the communication interface 320, such as within an analog front end (AFE) of the device 110). In this example of operation, device 110's processor 330 receives, via the communication interface 320, configuration information from device 120. Processor 330 determines the first, second, and composite VPA control signals based, at least in part, on the configuration information received from the device 120. Processor 330 is also configured to transmit, via the communication interface 320, the processed composite signal to device 120. Note also that processor 330 may be configured to consider other information as well, such as locally generated information (within the communication device), operational history, current operating conditions, etc. to determine the first, second, and composite VPA control signals.

In one implementation, the VPAs may be implemented within a first integrated circuit that includes functionality to interface with a second integrated circuit to receive the analog signals. The second integrated circuit includes digital to analog converters (DACs) to generate the analog signals (e.g., a first DAC configured to provide the first analog signal to the first VPA and second DAC configured to output the second analog signal to the second VPA). The first integrated circuit may be implemented as an external integrated circuit to the second integrated circuit that generates the analog signals, and the first integrated circuit processes those analog signals to generate a processed composite signal for transmission to device 120.

Examples of the configuration information received from device 120 may include any of a maximum power per signal for analog signals, a bandwidth or frequency range allocated for the analog signals, or a number of orthogonal frequency division multiplexing (OFDM) sub-carriers assigned for one analog signal of the plurality of analog signals, etc.

In an example of operation, device 110's processor 330 determines the first VPA control signal based on the configuration information that includes a number of orthogonal frequency division multiplexing (OFDM) sub-carriers assigned for the first analog signal. Then, processor 330 receives, via the communication interface 320, other configuration information from the device 120 and to determine another first VPA control signal (e.g., a different first VPA control signal, a modified first VPA control signal, an updated first VPA control signal, etc.) based on the other configuration information that includes another number of OFDM sub-carriers assigned for another first analog signal. In operation, the first VPA processes the first analog signal based on the first VPA control signal during a first time and to process the other first analog signal based on the other first VPA control signal during a second time. Note that different configuration information may specify different numbers of OFDM sub-carriers assigned for different devices at different times. Note also that configuration information may include information to specify different numbers of OFDM sub-carriers for different analog signals that are processed within device 110 at different times (e.g., first number of OFDM sub-carriers for first analog signal at first time and second number of OFDM sub-carriers for second analog signal at first time, and third number of OFDM sub-carriers for the first analog signal at second time and fourth number of OFDM sub-carriers for the second analog signal at second time).

Note also different analog signals that get processed by the VPAs may be based on different types of signaling. In another example of operation, a first analog signal is based on single-carrier (SC) signaling, and a second analog signal is based on orthogonal frequency division multiplexing (OFDM) multi-carrier signaling. In yet another example of operation, device 110 includes at least three VPAs such that a first VPA processes a first analog signal that is based on single-carrier (SC) signaling and compliant with a first communication protocol to generate a first processed analog signal, such that a second VPA processes a second analog signal that is based on orthogonal frequency division multiplexing (OFDM) multi-carrier signaling and compliant with a second communication protocol to generate a second processed analog signal, and such that a third VPA processes a third analog signal that is also based on OFDM multi-carrier signaling and compliant with the second communication protocol to generate a third processed analog signal. In some instances, the first communication protocol is a legacy version of the second communication protocol. A fourth VPA (e.g., composite VPA) processes, based on a composite VPA control signal, a composite signal that is a summation of the first, second, and third processed analog signals.

In another example of operation, device 110 is a cable modem, and device 120 is a cable headend transmitter or a cable modem termination system (CMTS). In yet another example of operation, device 110's communication interface 320 supports communications within at least one of a satellite communication system, a wireless communication system, a wired communication system, a fiber-optic communication system, or a mobile communication system.

FIG. 3B is a diagram illustrating an example 302 of operation of a communication device within one or more communication systems. Device 110 supports communications to and from one or more other devices, such as device 120. In an example operation, device 110 receives downstream (DS) communications from device 120 and to transmit upstream (US) communications to device 120. Examples of DS communications may include those containing configuration information. Examples of US communications may include communications that have been adapted based on the received configuration information received from device 120.

FIG. 3C is a diagram illustrating another example 303 of operation of a communication device within one or more communication systems. This diagram shows communications being made at different times between devices 110 and 120. At or during a first time (time 1), device 110 transmits first US communication to device 120. At or during the first time (time 1) or a second time (time 2), device 130 transmits second US communication to device 120. At or during a third time (time 3), device 130 processes the first and second US communications received from devices 110 and 130 to determine configuration information by which devices 110 and 130 should subsequently make US transmissions. Device 130 then transmits this determined configuration information to devices 110 and 130.

Then, at or during a fourth time (time 4), device 110 transmits third US communication to device 120. At or during the fourth time (time 4) or a fifth time (time 5), device 130 transmits fourth US communication to device 120.

This diagram shows an example by which different devices may be in communication with one another within a communication system and one of the devices, such as device 120, may determine and provide configuration information to other of the devices, such as devices 110 and 130, to direct the manner by which they are to support communications with device 120. Information included within the configuration information may include information by which one or more VPAs within devices 110 and 130 should be configured to support such operations. In an example operation, device 120 determines configuration information for both devices 110 and 130 based on multiple considerations including the particular assignment of OFDM sub-carriers allotted or granted to each of devices 110 and/or 130 for subsequent communications. Note that some communications provided from devices 110 and 130 may be based on single-carrier (SC) signaling and other communications provided from devices 110 and 130 may be based on orthogonal frequency division multiplexing (OFDM) signaling.

FIG. 4A is a diagram illustrating an example 401 of orthogonal frequency division multiplexing (OFDM) and/or orthogonal frequency division multiple access (OFDMA). OFDM's modulation may be viewed as dividing up an available spectrum into a plurality of narrowband sub-carriers (e.g., relatively lower data rate carriers). The sub-carriers are included within an available frequency spectrum portion or band. This available frequency spectrum is divided into the sub-carriers or tones used for the OFDM or OFDMA symbols and packets/frames. Typically, the frequency responses of these sub-carriers are non-overlapping and orthogonal. Each sub-carrier may be modulated using any of a variety of modulation coding techniques (e.g., as shown by the vertical axis of modulated data).

A communication device may be configured to perform encoding of one or more bits to generate one or more coded bits used to generate the modulation data (or generally, data). For example, a processor of a communication device may be configured to perform forward error correction (FEC) and/or error correction code (ECC) of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, etc. The one or more coded bits may then undergo modulation or symbol mapping to generate modulation symbols. The modulation symbols may include data intended for one or more recipient devices. Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

FIG. 4B is a diagram illustrating another example 402 of OFDM and/or OFDMA. A transmitting device transmits modulation symbols via the sub-carriers. OFDM and/or OFDMA modulation may operate by performing simultaneous transmission of a large number of narrowband carriers (or multi-tones). In some applications, a guard interval (GI) or guard space is sometimes employed between the various OFDM symbols to try to minimize the effects of ISI (Inter-Symbol Interference) that may be caused by the effects of multi-path within the communication system, which can be particularly of concern in wireless communication systems. In addition, a CP (Cyclic Prefix) and/or cyclic suffix (CS) (shown in right hand side of FIG. 4A) that may be a copy of the CP may also be employed within the guard interval to allow switching time, such as when jumping to a new communication channel or sub-channel, and to help maintain orthogonality of the OFDM and/or OFDMA symbols. Generally speaking, an OFDM and/or OFDMA system design is based on the expected delay spread within the communication system (e.g., the expected delay spread of the communication channel).

In a single-user system in which one or more OFDM symbols or OFDM packets/frames are transmitted between a transmitter device and a receiver device, all of the sub-carriers or tones are dedicated for use in transmitting modulated data between the transmitter and receiver devices. In a multiple user system in which one or more OFDM symbols or OFDM packets/frames are transmitted between a transmitter device and multiple recipient or receiver devices, the various sub-carriers or tones may be mapped to different respective receiver devices as described below with respect to FIG. 4C.

FIG. 4C is a diagram illustrating another example 403 of OFDM and/or OFDMA. Comparing OFDMA to OFDM, OFDMA is a multi-user version of the popular orthogonal frequency division multiplexing (OFDM) digital modulation scheme. Multiple access is achieved in OFDMA by assigning subsets of subcarriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignment may be dynamic among different respective transmissions (e.g., a first assignment for a first packet/frame, a second assignment for second packet/frame, etc.). An OFDM packet/frame may include more than one OFDM symbol. Similarly, an OFDMA packet/frame may include more than one OFDMA symbol. In addition, such sub-carrier/tone assignment may be dynamic among different respective symbols within a given packet/frame or super-frame (e.g., a first assignment for a first OFDMA symbol within a packet/frame, a second assignment for a second OFDMA symbol within the packet/frame, etc.). Note also that different configuration information may be provided with different periodicity. For example, some configuration information (e.g., a maximum power per signal for analog signals, a bandwidth or frequency range allocated for the analog signals, etc.) may be provided on a relatively infrequent basis (e.g., such that such configuration information remains in effect for a relatively longer period of time, until updated or modified) such that such configuration information may be viewed as static configuration information. Other configuration information (e.g., a number of orthogonal frequency division multiplexing (OFDM) sub-carriers assigned for at least one analog signal of a number of analog signals, percentage grant, etc.) may be provided on a relatively frequent basis (e.g., such that such configuration information remains in effect for a relatively shorter period of time, until updated or modified) such that such configuration information may be viewed as dynamic configuration information.

Generally speaking, an OFDMA symbol is a particular type of OFDM symbol, and general reference to OFDM symbol herein includes both OFDM and OFDMA symbols (and general reference to OFDM packet/frame herein includes both OFDM and OFDMA packets/frames, and vice versa). FIG. 4C shows example 403 where the assignments of sub-carriers to different users are intermingled among one another (e.g., sub-carriers assigned to a first user includes non-adjacent sub-carriers and at least one sub-carrier assigned to a second user is located in between two sub-carriers assigned to the first user). The different groups of sub-carriers associated with each user may be viewed as being respective channels of a plurality of channels that compose all of the available sub-carriers for OFDM signaling.

FIG. 4D is a diagram illustrating another example 404 of OFDM and/or OFDMA. This example 404 where the assignments of sub-carriers to different users are located in different groups of adjacent sub-carriers (e.g., first sub-carriers assigned to a first user include first adjacently located sub-carrier group, second sub-carriers assigned to a second user include second adjacently located sub-carrier group, etc.). The different groups of adjacently located sub-carriers associated with each user may be viewed as being respective channels of a plurality of channels that compose all of the available sub-carriers for OFDM signaling.

FIG. 4E is a diagram illustrating an example 405 of single-carrier (SC) signaling. SC signaling, when compared to OFDM signaling, includes a singular relatively wide channel across which signals are transmitted. In OFDM, multiple narrowband sub-carriers or narrowband sub-channels span the available frequency range, bandwidth, or spectrum across which signals are transmitted within the narrowband sub-carriers or narrowband sub-channels. In some instances, a device employs VPAs to process at least one analog signal based on SC signaling and at least one other analog signal based on OFDM signaling to generate processed analog signals. Then, a composite VPA processes, based on a composite VPA control signal, a composite signal that is a summation of the processed analog signals (e.g., that are generated based on analog signals based on both SC and OFDM signaling).

Figure 5:
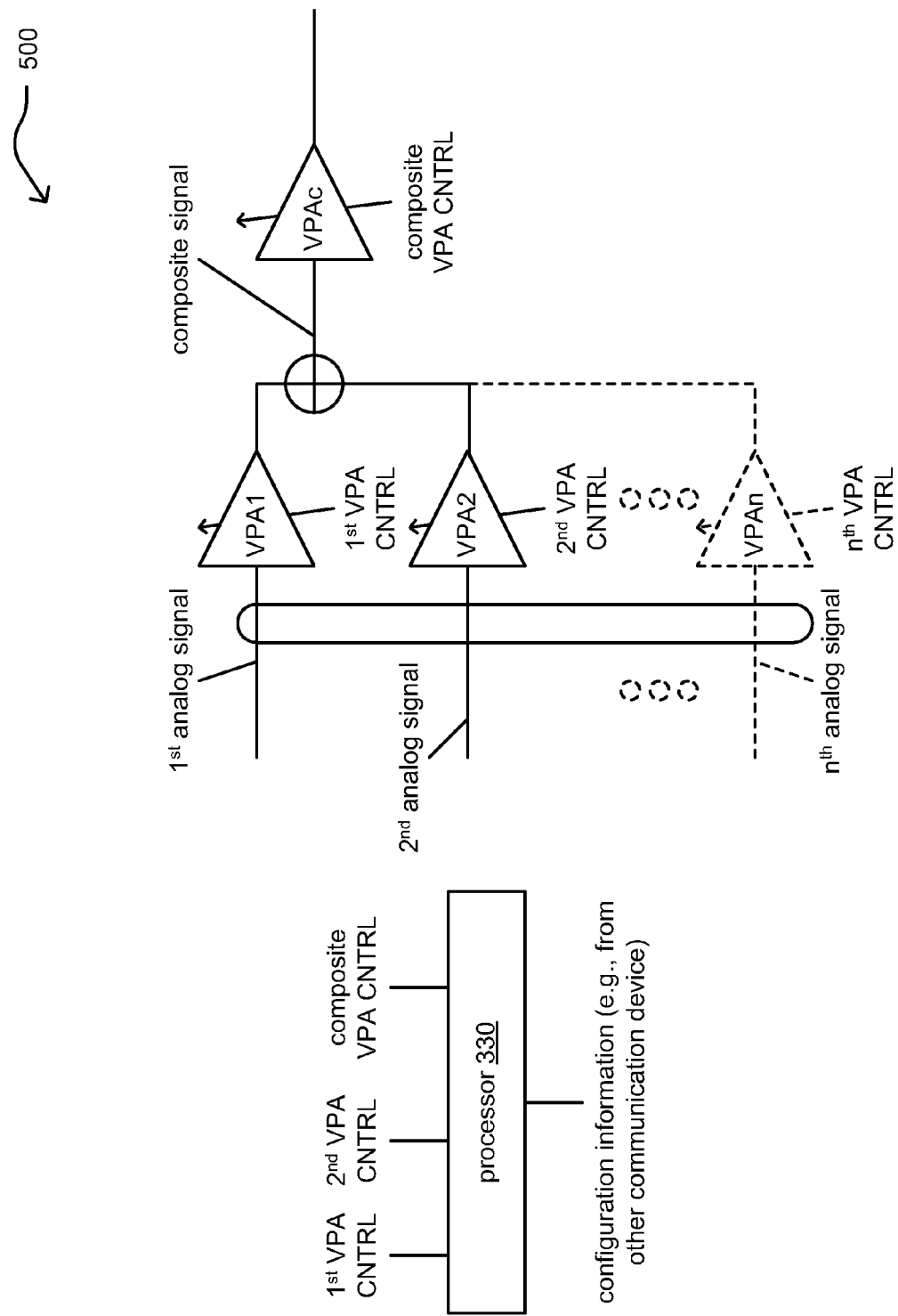
FIG. 5 is a diagram illustrating an example of an amplifier that includes multiple variable power amplifiers (VPAs).

FIG. 5 is a diagram illustrating an example 500 of an amplifier that includes multiple variable power amplifiers (VPAs). This diagram shows at least two or up to n (any integer greater than or equal to 3) VPAs that are configured to process analog signals to generate processed analog signals. Each of the VPAs is controlled by respective VPA control signal. For example, a first VPA processes a first analog signal based on first VPA control signal to generate a first processed analog signal, and a second VPA processes a second analog signal based on second VPA control signal to generate a second processed analog signal. A composite VPA processes, based on a composite VPA control signal, a composite signal that is a summation of the first and second processed analog signals to generate a processed composite signal.

Processor 330 receives, via a communication interface, configuration information from another communication device. Processor 330 determines the first, second, and composite VPA control signals based, at least in part, on the configuration information. Processor 330 may also be configured to consider other information, such as locally generated information (within the communication device), operational history, current operating conditions, etc. to determine the first, second, and composite VPA control signals. Processor 330 is then configured to transmit, via the communication interface, the processed composite signal to the other communication device.

Figure 6:
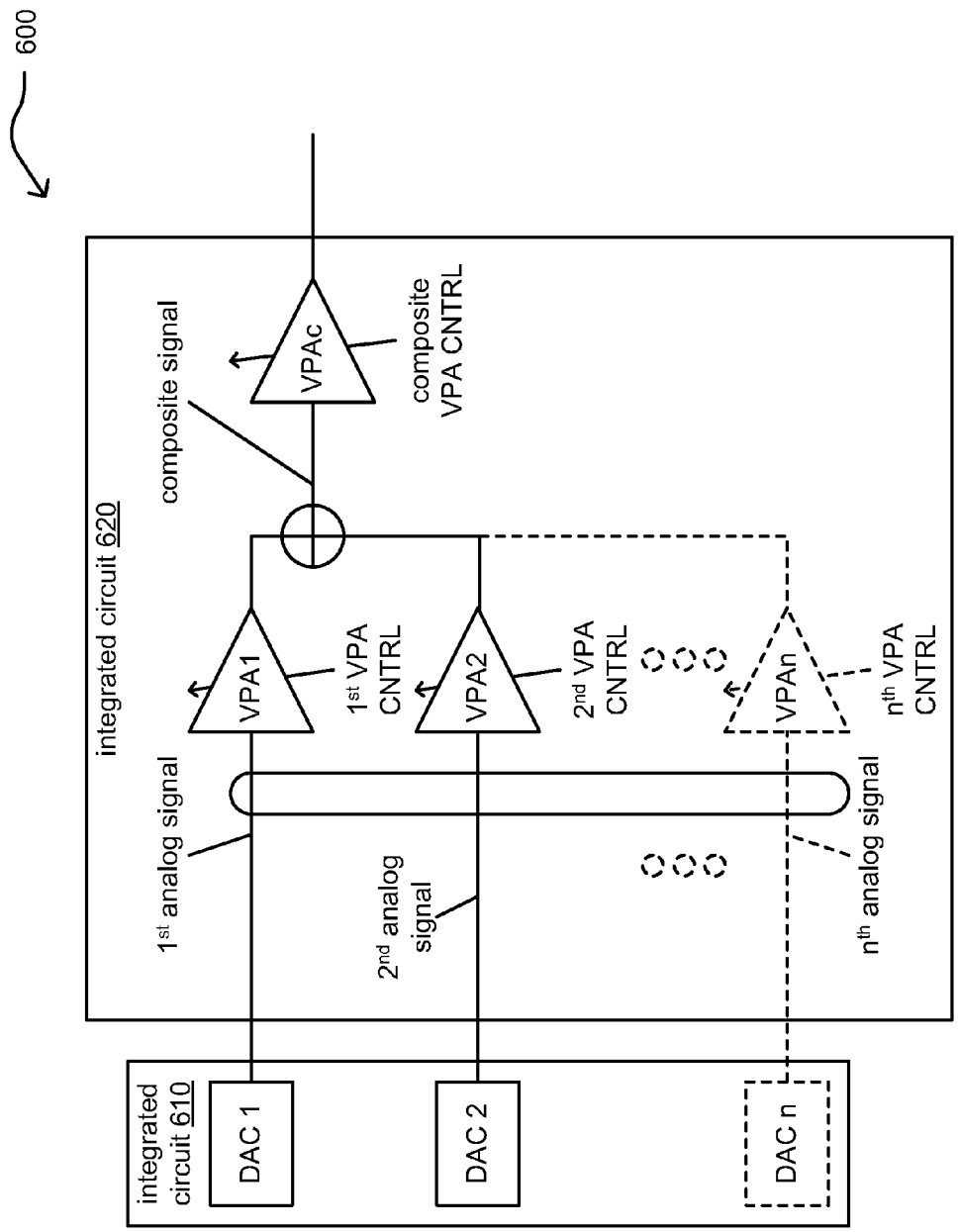
FIG. 6 is a diagram illustrating an example of a device that includes multiple integrated circuits.

FIG. 6 is a diagram illustrating an example 600 of a device that includes multiple integrated circuits. This diagram has similarities to the prior diagram of FIG. 5 with at least some differences being that two integrated circuits 610 and 620 are implemented to perform generation and/or processing of different signals. At least two or up to n (any integer greater than or equal to 3) VPAs are configured to process analog signals to generate processed analog signals that undergo combination to generate a composite signal. A composite VPA processes the composite signal based on a composite VPA control signal to generate a processed composite signal. The integrated circuit 610 includes least two or up to n (any integer greater than or equal to 3) digital to analog converters (DACs) configured to generate the at least two or up to n (any integer greater than or equal to 3) analog signals. The integrated circuit 610 interfaces with the integrated circuit 620 to provide the at least two or up to n (any integer greater than or equal to 3) analog signals to the at least two or up to n (any integer greater than or equal to 3) VPAs. The composite VPA outputs the processed composite signal off chip for transmission to another device. The integrated circuit 620 may be viewed as a first integrated circuit that includes one or more communication interfaces configured to receive the at least two or up to n (any integer greater than or equal to 3) analog signals from the integrated circuit 610 that is a second integrated circuit. The integrated circuit 610 (e.g., second integrated circuit) includes at least first digital to analog converter (DAC) configured to provide the first analog signal to the first VPA and second DAC configured to output the second analog signal to the second VPA.

Figure 7:
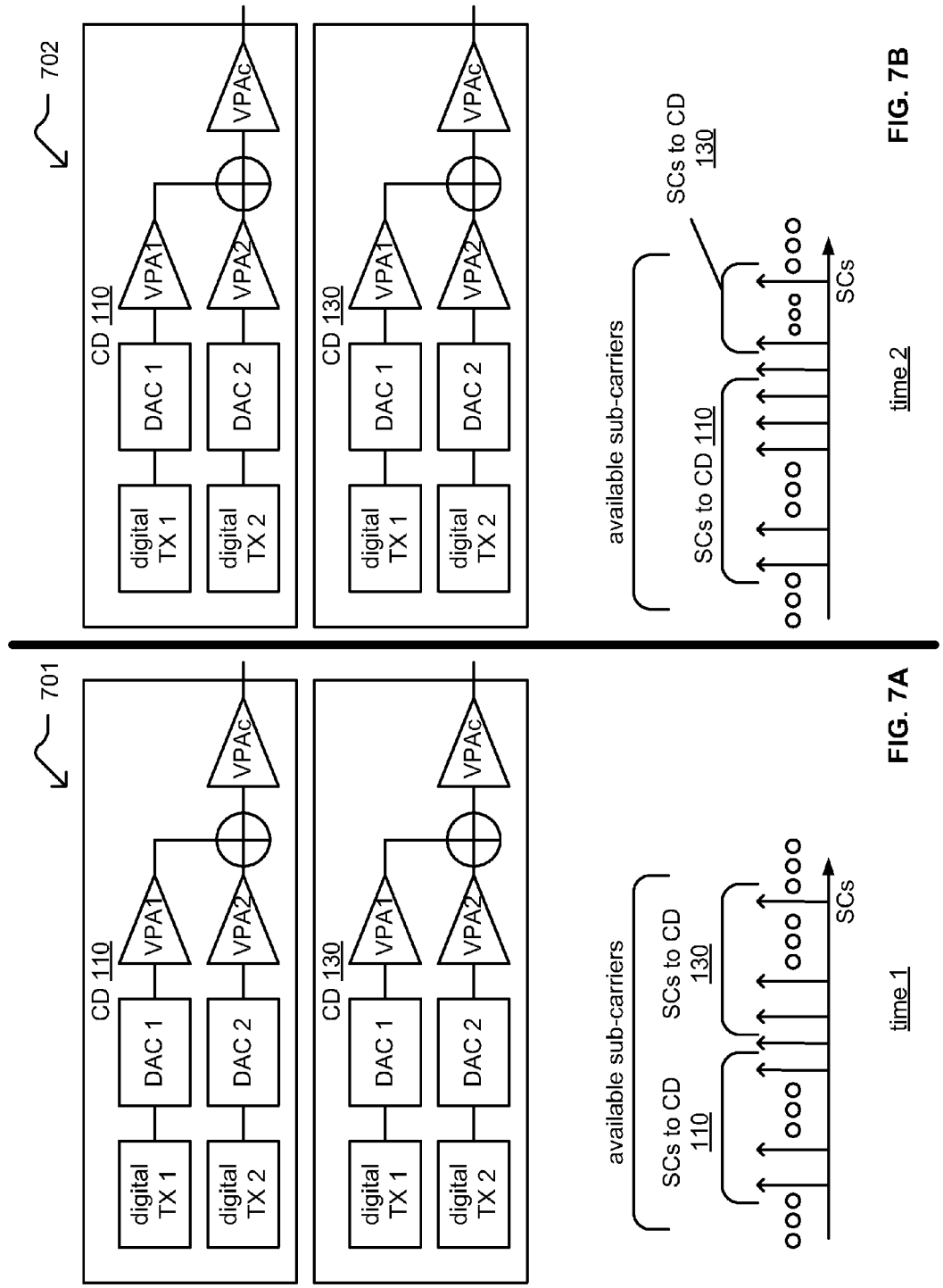
FIG. 7A is a diagram illustrating an example of multiple devices that operate at or during a first time based on first configuration information that includes first sub-carrier assignment for the devices.
FIG. 7B is a diagram illustrating an example of the multiple devices that operate at or during a second time based on second configuration information that includes second sub-carrier assignment for the devices.

FIG. 7A is a diagram illustrating an example 701 of multiple devices that operate at or during a first time based on first configuration information that includes first sub-carrier assignment for the devices. In this diagram, device 110 and device 130 each respectively includes at least two digital transmitters, two DACs, 2 VPAs, and a composite VPA. In an example of operation, considering device 110, a first digital transmitter generates a first digital signal that is converted from the digital or discrete time domain to the analog or continuous time domain into a first analog signal that is processed by a first VPA to generate a first processed analog signal. Similarly, a second digital transmitter generates a second digital signal that is converted from the digital or discrete time domain to the analog or continuous time domain into a second analog signal that is processed by a second VPA to generate a second processed analog signal. Note that digital gain adjustment and/or scaling may also be performed within either of the digital transmitters or DACs within the digital or discrete time domain as well, if desired. The first and second processed analog signals are combined to generate a composite signal that is subsequently processed by a composite VPA to generate a composite VPA.

At or during a first time (time 1), different numbers of sub-carriers are assigned for use by each of the devices 110 and 130. For example, considering a number of available sub-carriers, a first subset of those sub-carriers is assigned for device 110, and a second subset of those sub-carriers is assigned for device 130. Note that while this diagram pictorially illustrates that each of the respective subsets of those sub-carriers that are assigned to the devices 110 and 130 are each contiguous subsets of sub-carriers, either subset of sub-carriers may be selected to include noncontiguous and/or nonadjacent sub-carriers. Generally speaking, any assignment, grant, or allotment of sub-carriers to different devices may be made for the devices 110 and 130.

FIG. 7B is a diagram illustrating an example 702 of the multiple devices that operate at or during a second time based on second configuration information that includes second sub-carrier assignment for the devices. This diagram may be considered in conjunction with example 701 of FIG. 7A in terms of the components within devices 110 and 130 and their operation. The assignment of sub-carriers for use by different devices may be dynamic, in that, different sub-carriers may be assigned for use by different devices at different times. For example, at or during a second time (time 2), different numbers of sub-carriers are assigned for use by each of the devices 110 and 130. For example, considering a number of available sub-carriers, a third subset of those sub-carriers is assigned for device 110, and a fourth subset of those sub-carriers is assigned for device 130. When compared to example 701 of FIG. 7A, different allocations of the available sub-carriers is made for devices 110 and 130.

Note that this sub-carrier allocation may be provided via or included within configuration information provided from another device, such as from device 122 devices 110 and 130 within a configuration such as that of FIG. 1, FIG. 3 see, etc. Note also that the respective values by which different VPAs within devices 110 and 130 operate may be adjusted and based upon the particular allocation of sub-carriers to devices 110 and 130.

Also, considering two different digital transmitters within a given device, two different digital transmitters may be configured to transmit simultaneously using different numbers of sub-carriers (e.g., Nsc_1 and Nsc_2, respectively) such that the output power per sub-carrier is equalized so Psc_1=Psc_2=Psc. The transmission power from the different devices is then different based on the different numbers of sub-carriers assigned: Nsc_1×Psc, Nsc_2×Psc, respectively.

To achieve relatively lower noise, a DAC's input should be approximately at the same level, without extreme swings in value, to maximize signal to quantization noise. Both the digital gain (scaling) and analog gain should be set according to the number of sub-carriers assigned to the device. If desired, some implementations may provide some time or time period to stabilize analog gain. For example, the aggregate noise generated by transmission from multiple devices may be reduced, mitigated, minimize, and/or eliminated by controlling the analog gain of the sub-amplifiers (e.g., VPAs within the devices) system. This noise may be caused by a number of sources including DAC quantization and/or amplifier noise figure (NF). In either case, increasing the value of the signal output from the DAC (e.g., increasing the output amplitude, by modifying the digital gain) and simultaneously reducing the sub-amplifier gain(s) of the VPA(s) (e.g., particularly in the case of small grants of sub-carriers for use by a given device) can reduce the overall noise within the system including that which is perceived by a headend device that supports communications with multiple downstream devices.

Note however, that such analog gain control may introduce brief glitches in a generated OFDM waveform. As such, some implementations may provide some time or time period to stabilize analog gain. That is to say, some look-ahead in the grant-size command (e.g., the grant that assigns sub-carriers for use by devices) may be provided to issue coordinated and counteracting digital and analog gain commands to the DAC(s) and sub-amplifier(s) (e.g., VPA(s)) of the various devices. This look-ahead can help mitigate any possible brief glitches in an OFDM waveform that may be generated by analog gain control.

Note that such glitches may be exacerbated when there are relatively small grant percentages of sub-carriers provided to a given device, such as with reference to FIG. 7A or FIG. 7B. The granting of sub-carriers is dynamic and may very almost instantaneously. Note also that the number of sub-carriers granted to a device may be anywhere from 100% of the available transmission bandwidth to less than 1%. Some implementations may operate based on the assumption that grants are greater than or equal to 0.4% of the full available transmission bandwidth. Based on this assumption, any given grant power will be greater than or equal to 0.4% of the full transmission power, or −24 dB. With respect to the amplitude of such a grant, the grant amplitude, a grant may be as small as 1/16 of a full transmission amplitude that occupies the full available transmission bandwidth. Note that any desired assignment of sub-carriers may be provided to any desired number of devices within the system, and such assignment may vary significantly over time.

Figure 8:
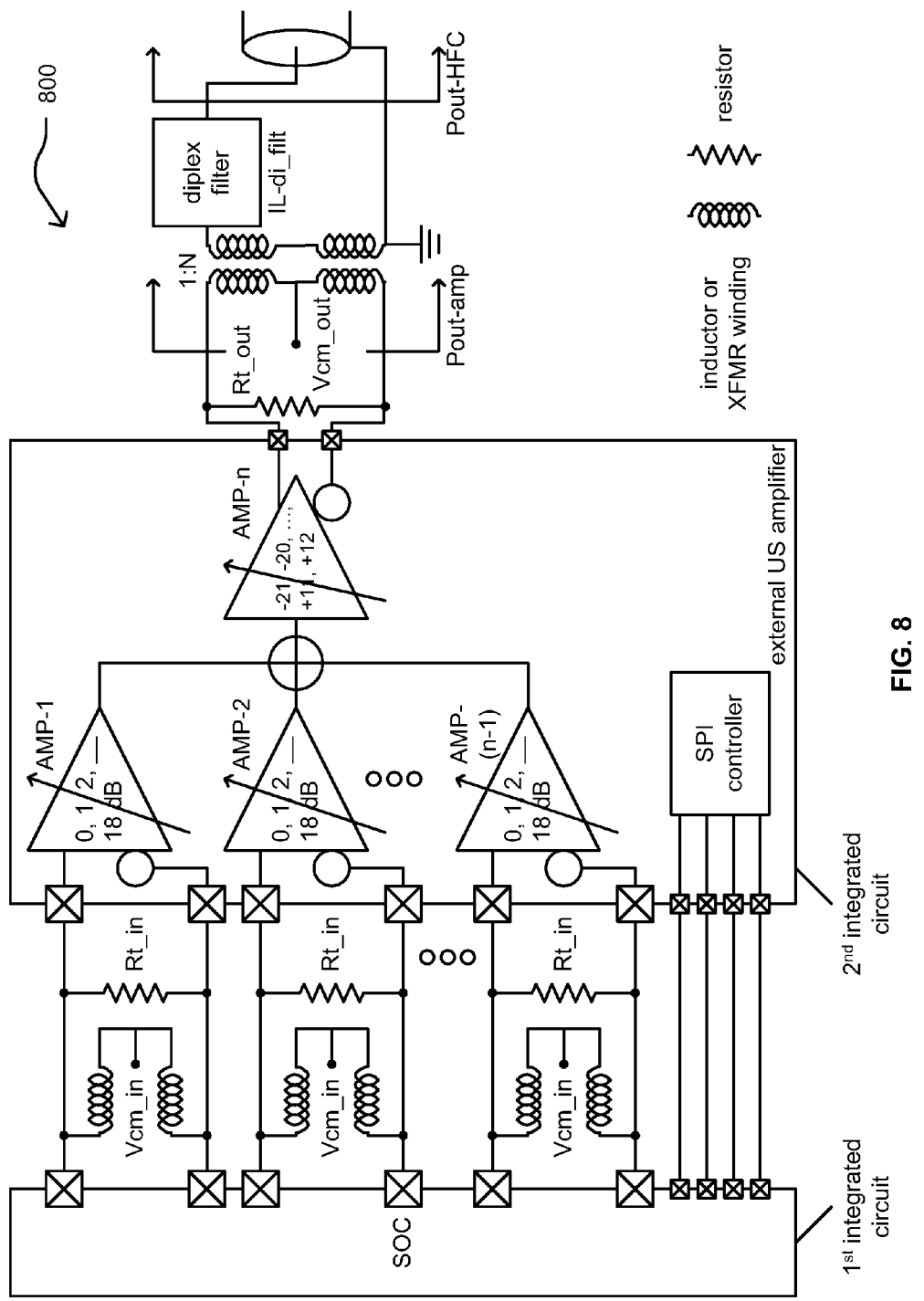
FIG. 8 is a diagram illustrating another example of an amplifier that includes multiple VPAs.

FIG. 8 is a diagram illustrating another example 800 of an amplifier that includes multiple VPAs. In this diagram, an external upstream (US) amplifier is implemented externally between one or more circuits of a communication device such as a cable modem (e.g., shown pictorially as a 'system on a chip' or SOC) on the left-hand side of the diagram and a communication link that communicatively couples such a communication device to other portions of a cable-based communication system. Such a cable-based communication system may be implemented using some of the features and characteristics as described with reference to FIG. 2.

In this diagram, three or more independent pre-amplifiers operate on differential signals output from the SOC. A common mode voltage is applied at the three or more respective nodes shown in between the inductors, Vcm_in, that connect to the differential input lines from the SOC. Shunt impedances, shown as Rt_in, are connected between the differential input lines from the SOC.

The power amplifier may be implemented as an external upstream (US) amplifier between a communication device (e.g., cable modem) and a communication link connecting that communication device to the remainder of the communication system. Note that such an external upstream amplifier can be implemented as an external circuitry or integrated circuit implemented separately from the communication device such as a cable modem (e.g., shown pictorially as the system on a chip, SOC).

The power amplifier includes the three or more independent pre-amplifiers, which may be adjustable or variable (e.g., implemented as VPAs), to process the three different differential signals provided from the SOC. The outputs from the three or more independent pre-amplifiers are summed together to generate a composite signal that is input to a common, final output power amplifier stage (e.g., composite VPA). Again, the three or more independent pre-amplifiers and the final output power amplifier/composite power amplifier may each be respectively adjustable or variable (e.g., implemented as VPAs). The use of multiple independent inputs will operate to increase and maximize the overall system's dynamic range. In one example of operation, each of the respective inputs is dedicated to one channel (e.g., one DOCSIS 3.1 channel which may be composed of two orthogonal frequency division multiplexing (OFDM) channels and one legacy channel operative based on single-carrier (SC) signaling, which may be operative based on a legacy DOCSIS standard relative to DOCSIS 3.1 standard).

The output levels, which are provided on the three or more differential output ports from the SOC, and the external US amplifier gains may be independently chosen for effective use of the system dynamic range (e.g., to maximize the dynamic range fully). The use of independent gain control among the various output levels and the external US amplifier gains extends and enhances operation based on certain communication standards (e.g., DOCSIS 3.1).

Note also that the power amplifier gain control may be implemented alternatively as a segmented amplifier to improve efficiency at lower output power settings. For example, such a power amplifier may be implemented using a number of power amplification segments implemented in a more serial architecture than the three or more pre-amplifiers operating in conjunction with the final output power amplifier shown in the diagram. Note also that while such an architecture for a power amplifier has been described with respect to cable-based communication systems, such an architecture may generally be applied to any multi-channel communication system in other communication system applications (e.g., optical, wireless, satellite, etc.).

FIG. 9A is a diagram illustrating an embodiment of a method 901 for execution by one or more wireless communication devices. The method 901 begins by receiving configuration information from another communication device (e.g., via a communication interface of the communication device,) (block 910). The method 901 continues by determining first, second, and composite variable power amplifier (VPA) control signals based on the configuration information (block 920).

The method 901 then operates by operating a first VPA to process a first analog signal to generate a first processed analog signal based on the first VPA control signal (block 930). The method 901 then operates by operating a second VPA to process a second analog signal to generate a second processed analog signal based on the second VPA control signal (block 940). The method 901 then operates by operating a composite VPA to process a composite analog signal (e.g., that is a summation of the first and second processed analog signals) to generate a processed composite analog signal based on the composite VPA control signal (block 950).

The method 901 then operates by transmitting (e.g., via the communication interface) the processed composite signal to the other communication device (block 960).

FIG. 9B is a diagram illustrating another embodiment of a method 902 for execution by one or more wireless communication devices. The method 902 begins by operating a first VPA using a first gain, a second VPA using a second game, and a composite VPA using a composite gained based on first configuration information (block 911). The method 902 continues by operating the first VPA using another first gain, the second VPA using another second game, and the composite VPA using another composite gained based on second configuration information (block 921). Note that different configuration information may be received by a device and/or generated by the device at different times.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Note that when transistors are used to implement various components depicted in the above described figure(s) (e.g., including various VPAs, circuits, etc.), such transistors may be implemented using field effect transistors (FETs), and/or any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:
1. A communication device comprising:
a communication interface;
a plurality of variable power amplifiers (VPAs) configured to process a plurality of analog signals to generate a plurality of processed analog signals, wherein a first variable power amplifier (VPA) is configured to process a first analog signal based on a first VPA control signal, wherein a second VPA is configured to process a second analog signal based on a second VPA control signal;
a composite VPA configured to process, based on a composite VPA control signal, a composite signal that is a summation of the plurality of processed analog signals to generate a processed composite signal; and
a processor configured to:
receive, via the communication interface, configuration information from another communication device;
determine the first VPA control signal, the second VPA control signal, and the composite VPA control signal based on the configuration information; and
transmit, via the communication interface, the processed composite signal to the another communication device.

2. The communication device of claim 1 further comprising:
a first integrated circuit that includes another communication interface configured to receive the plurality of analog signals from a second integrated circuit that includes a first digital to analog converter (DAC) configured to provide the first analog signal to the first VPA and a second DAC configured to output the second analog signal to the second VPA.

3. The communication device of claim 1, wherein the configuration information includes at least one of a maximum power per signal for the plurality of analog signals, a bandwidth, or a frequency range allocated for the plurality of analog signals, or a number of orthogonal frequency division multiplexing (OFDM) sub-carriers assigned for one analog signal of the plurality of analog signals.

4. The communication device of claim 1 further comprising:
the processor configured to:
determine the first VPA control signal based on the configuration information, wherein the configuration information includes a number of orthogonal frequency division multiplexing (OFDM) sub-carriers assigned for the first analog signal;
receive, via the communication interface, other configuration information from the another communication device; and
determine another first VPA control signal based on the other configuration information, wherein the other configuration information includes another number of OFDM sub-carriers assigned for another first analog signal; and
the first VPA configured to process the first analog signal based on the first VPA control signal during a first time and to process the another first analog signal based on the another first VPA control signal during a second time.

5. The communication device of claim 1 further comprising:
a first communication device, wherein the another communication device is a second communication device;
the processor configured to:
determine the first VPA control signal based on the configuration information, wherein the configuration information includes a first number of orthogonal frequency division multiplexing (OFDM) sub-carriers assigned for the first analog signal and a second number of OFDM sub-carriers assigned for a third communication device that is configured to communicate with the second communication device as determined by the second communication device based on first sub-carrier allocation of a plurality of available sub-carriers for the first and third communication devices;
receive, via the communication interface, other configuration information from the another communication device; and
determine another first VPA control signal based on the other configuration information, wherein the other configuration information includes another first number of OFDM sub-carriers assigned for another first analog signal and another second number of OFDM sub-carriers assigned for the third communication device as determined by the second communication device based on a second sub-carrier allocation of the plurality of available sub-carriers for the first and third communication devices; and
the first VPA configured to process the first analog signal based on the first VPA control signal during a first time and to process the another first analog signal based on the another first VPA control signal during a second time.

6. The communication device of claim 1, wherein the first analog signal is based on single-carrier (SC) signaling, and the second analog signal is based on orthogonal frequency division multiplexing (OFDM) multi-carrier signaling.

7. The communication device of claim 1 further comprising:
the plurality of VPAs also includes a third VPA, wherein the third VPA is configured to process a third analog signal based on a third VPA control signal, wherein the first analog signal is based on single-carrier (SC) signaling and compliant with a first communication protocol, wherein the second analog signal and the third analog signal are based on orthogonal frequency division multiplexing (OFDM) multi-carrier signaling and compliant with a second communication protocol, wherein the first communication protocol is a legacy version of the second communication protocol.

8. The communication device of claim 1 further comprising:
a cable modem, wherein the another communication device is a cable headend transmitter or a cable modem termination system (CMTS).

9. The communication device of claim 1 further comprising:
the communication interface configured to support communications within at least one of a satellite communication system, a wireless communication system, a wired communication system, a fiber-optic communication system, or a mobile communication system.

10. A communication device comprising:
a communication interface;
a plurality of variable power amplifiers (VPAs) configured to process a plurality of analog signals to generate a plurality of processed analog signals, wherein a first VPA is configured to process a first analog signal based on a first VPA control signal, wherein a second VPA is configured to process a second analog signal based on a second VPA control signal;
a composite VPA configured to process, based on a composite VPA control signal, a composite signal that is a summation of the plurality of processed analog signals to generate a processed composite signal; and
a processor configured to:
receive, via the communication interface, configuration information from a first other communication device, wherein the configuration information includes a first number of orthogonal frequency division multiplexing (OFDM) sub-carriers assigned for the communication device to generate the first analog signal and a second number of OFDM sub-carriers assigned for a second other communication device that is configured to communicate with the first other communication device as determined by the first other communication device based on a sub-carrier allocation of a plurality of available sub-carriers for the communication device and the second other communication device, wherein the configuration information also includes at least one of a maximum power per signal for the plurality of analog signals, a bandwidth, or a frequency range allocated for the plurality of analog signals;
determine the first VPA control signal, the second VPA control signal, and the composite VPA control signal based on the configuration information; and
transmit, via the communication interface, the processed composite signal to the first other communication device.

11. The communication device of claim 10 further comprising:

a first integrated circuit that includes another communication interface configured to receive the plurality of analog signals from a second integrated circuit that includes a first digital to analog converter (DAC) configured to provide the first analog signal to the first VPA and a second DAC configured to output the second analog signal to the second VPA.

12. The communication device of claim 10, wherein the first analog signal is based on single-carrier (SC) signaling, and the second analog signal is based on orthogonal frequency division multiplexing (OFDM) multi-carrier signaling.

13. The communication device of claim 10 further comprising:
   a cable modem, wherein the first other communication device is a cable headend transmitter or a cable modem termination system (CMTS).

14. A method for execution by a communication device, the method comprising:
   receiving, via a communication interface of the communication device, configuration information from another communication device;
   determining a first variable power amplifier (VPA) control signal, a second VPA control signal, and a composite VPA control signal based on the configuration information;
   operating a plurality of VPAs to process a plurality of analog signals to generate a plurality of processed analog signals including operating a first VPA to process a first analog signal based on the first VPA control signal and including operating a second VPA to process a second analog signal based on the second VPA control signal;
   operating a composite VPA to process, based on the composite VPA control signal, a composite signal that is a summation of the plurality of processed analog signals to generate a processed composite signal; and
   transmitting, via the communication interface, the processed composite signal to the another communication device.

15. The method of claim 14, wherein the communication device includes a first integrated circuit that includes another communication interface configured to receive the plurality of analog signals from a second integrated circuit that includes a first digital to analog converter (DAC) configured to provide the first analog signal to the first VPA and a second DAC configured to output the second analog signal to the second VPA.

16. The method of claim 14, wherein the configuration information includes at least one of a maximum power per signal for the plurality of analog signals, a bandwidth, or a frequency range allocated for the plurality of analog signals, or a number of orthogonal frequency division multiplexing (OFDM) sub-carriers assigned for one analog signal of the plurality of analog signals.

17. The method of claim 14, wherein the first analog signal is based on single-carrier (SC) signaling, and the second analog signal is based on orthogonal frequency division multiplexing (OFDM) multi-carrier signaling.

18. The method of claim 14, wherein the plurality of VPAs also includes a third VPA; and further comprising:
   operating the third VPA to process a third analog signal based on a third VPA control signal, wherein the first analog signal is based on single-carrier (SC) signaling and compliant with a first communication protocol, wherein the second analog signal and the third analog signal are based on orthogonal frequency division multiplexing (OFDM) multi-carrier signaling and compliant with a second communication protocol, wherein the first communication protocol is a legacy version of the second communication protocol.

19. The method of claim 14, wherein the communication device is a cable modem, and the another communication device is a cable headend transmitter or a cable modem termination system (CMTS).

20. The method of claim 14 further comprising:
   operating the communication interface of the communication device to support communications within at least one of a satellite communication system, a wireless communication system, a wired communication system, a fiber-optic communication system, or a mobile communication system.

* * * * *